(12) United States Patent
Sforzin et al.

(10) Patent No.: US 10,976,936 B2
(45) Date of Patent: Apr. 13, 2021

(54) SENSING OPERATIONS IN MEMORY

(71) Applicant: Micron Technology, Inc., Boise, ID (US)

(72) Inventors: Marco Sforzin, Cernusco sul Naviglio (IT); Paolo Amato, Treviglio (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/683,821

(22) Filed: Aug. 23, 2017

(65) Prior Publication Data
US 2019/0065077 A1    Feb. 28, 2019

(51) Int. Cl.
| | | |
|---|---|---|
| *G11C 16/16* | (2006.01) | |
| *G06F 3/06* | (2006.01) | |
| *G11C 7/22* | (2006.01) | |
| *G11C 16/34* | (2006.01) | |
| *G11C 7/08* | (2006.01) | |
| *G11C 13/00* | (2006.01) | |
| *G11C 8/12* | (2006.01) | |

(52) U.S. Cl.
CPC .......... *G06F 3/0616* (2013.01); *G06F 3/0631* (2013.01); *G06F 3/0644* (2013.01); *G06F 3/0673* (2013.01); *G11C 7/08* (2013.01); *G11C 7/22* (2013.01); *G11C 8/12* (2013.01); *G11C 13/004* (2013.01); *G11C 16/3495* (2013.01); *G11C 2213/73* (2013.01)

(58) Field of Classification Search
CPC .... G06F 3/0616; G06F 3/0631; G06F 3/0644; G06F 3/0673; G11C 7/22
USPC .................................................... 365/189.15
See application file for complete search history.

(56) References Cited

U.S. PATENT DOCUMENTS

| | | | |
|---|---|---|---|
| 5,270,979 A | 12/1993 | Harari et al. | |
| 7,012,835 B2 | 3/2006 | Gonzalez et al. | |
| 7,495,966 B2* | 2/2009 | Aritome ............. | G11C 11/5628 365/185.24 |
| 8,737,129 B2* | 5/2014 | Lee .......................... | G11C 8/10 365/185.09 |
| 8,902,653 B2* | 12/2014 | Radke ................ | G11C 11/5628 365/185.09 |

(Continued)

FOREIGN PATENT DOCUMENTS

| | | |
|---|---|---|
| JP | 2010-073296 A | 4/2010 |
| JP | 2010-198687 A | 9/2010 |

OTHER PUBLICATIONS

Qingsong Wei et al., WAFTL: A Workload Adaptive Flash Translation Layer with Data Partition, IEEE 27th Symposium on Massive Storage Systems and Technologies (MSST), May 23-27, 2011.*

(Continued)

*Primary Examiner* — Xiaochun L Chen
(74) *Attorney, Agent, or Firm* — Brooks, Cameron & Huebsch, PLLC

(57) ABSTRACT

The present disclosure includes apparatuses and methods related to sensing operations in memory. An example apparatus can perform sensing operations on an array of memory cells by applying a first signal to a first portion of the array of memory cells and a second signal to a second portion of the array of memory cells.

27 Claims, 4 Drawing Sheets

(56) References Cited

U.S. PATENT DOCUMENTS

| | | | |
|---|---|---|---|
| 8,964,476 B2* | 2/2015 | Shim | G11C 16/0483 365/185.17 |
| 2007/0147113 A1 | 6/2007 | Mokhlesi et al. | |
| 2007/0253256 A1* | 11/2007 | Aritome | G11C 11/5628 365/185.24 |
| 2010/0124122 A1* | 5/2010 | Jeong | G11C 16/10 365/185.19 |
| 2010/0214820 A1 | 8/2010 | Bang et al. | |
| 2012/0008399 A1 | 1/2012 | Hoei et al. | |
| 2012/0120732 A1* | 5/2012 | Lee | G11C 8/10 365/185.22 |
| 2012/0163082 A1 | 6/2012 | Confalonieri | |
| 2013/0039129 A1* | 2/2013 | Radke | G11C 11/5628 365/185.09 |
| 2013/0346812 A1 | 12/2013 | Bahirat et al. | |
| 2014/0056069 A1* | 2/2014 | Park | G11C 16/0483 365/185.05 |
| 2014/0126285 A1* | 5/2014 | Kang | G11C 16/26 365/185.2 |
| 2014/0269070 A1 | 9/2014 | Hsiung et al. | |
| 2014/0369124 A1* | 12/2014 | Moon | G11C 16/16 365/185.11 |
| 2015/0117118 A1* | 4/2015 | Shim | G11C 16/0483 365/185.29 |
| 2016/0225461 A1 | 8/2016 | Tuers et al. | |
| 2016/0284399 A1 | 9/2016 | Mantegazza et al. | |
| 2017/0125095 A1 | 5/2017 | Mittelholzer et al. | |
| 2017/0206979 A1 | 7/2017 | Cohen et al. | |

OTHER PUBLICATIONS

International Search Report and Written Opinion from related international application No. PCT/US2018/047180, dated Dec. 13, 2018, 13 pp.

Notice of Rejection Ground from related Japanese patent application No. 2020-510088, dated Feb. 2, 2021, 11 pages.

* cited by examiner

SENSING OPERATIONS IN MEMORY

TECHNICAL FIELD

The present disclosure relates generally to memory devices, and more particularly, to apparatuses and methods for sensing operations in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory system used in computing devices. Memory systems can include volatile, such as DRAM, for example, and/or non-volatile memory, such as Flash memory or RRAM, for example.

DETAILED DESCRIPTION

Figure 1A:
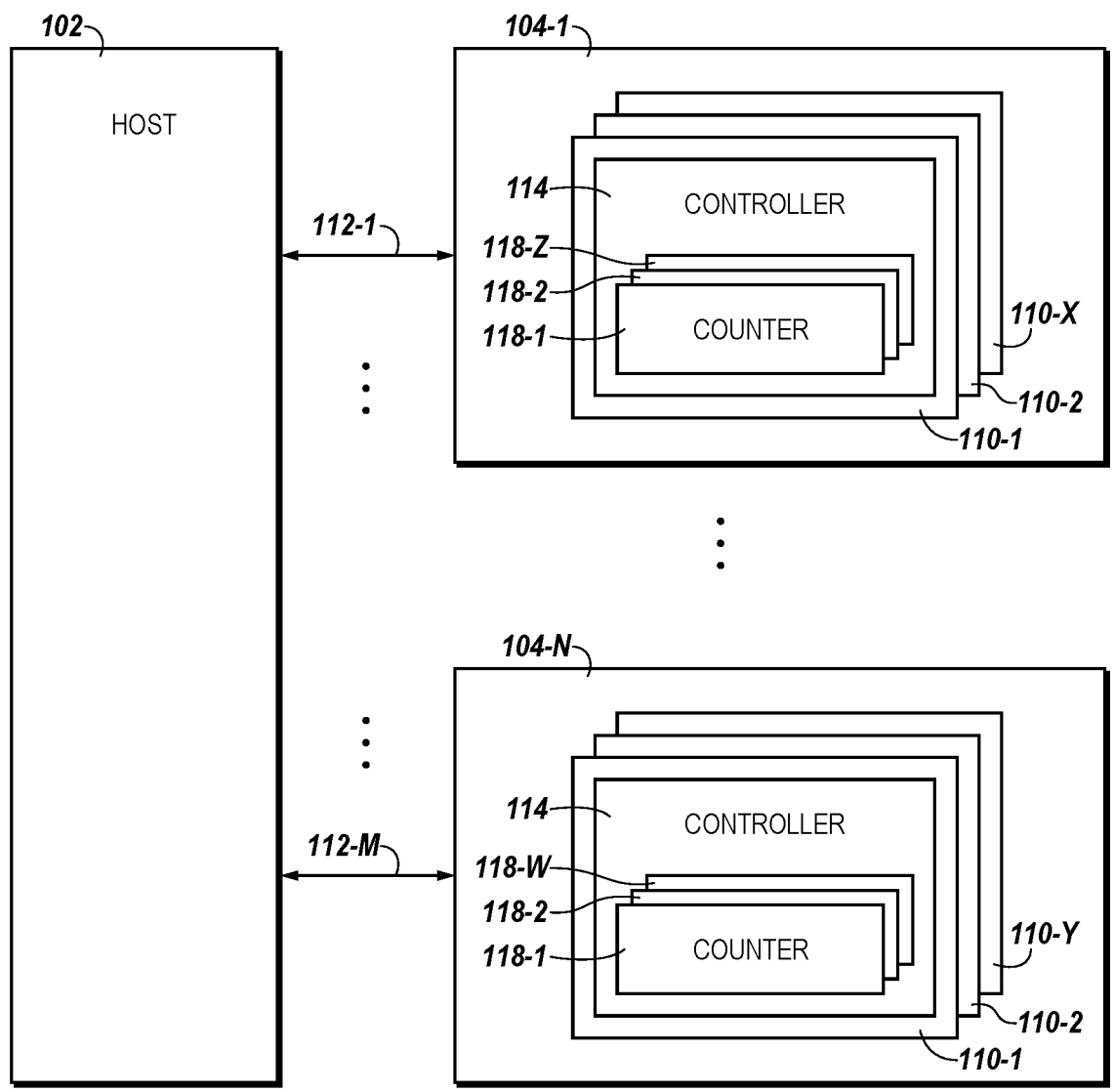
FIG. 1A is a block diagram of an apparatus in the form of a computing system including a memory system in accordance with a number of embodiments of the present disclosure.

The present disclosure includes apparatuses and methods related to sensing operations in memory. An example apparatus can perform sensing operations on an array of memory cells by applying a first signal to a first portion of the array of memory cells and a second signal to a second portion of the array of memory cells.

In one or more embodiments of the present disclosure, a controller can be configured to partition an array of memory cells into one or more portions and perform a sensing operation on the array of memory cells by applying a number of signals to the one or more portions of the array of memory cells. The signal applied, for example, can be based on a number of cycles performed on particular portions of the array of memory cells. The controller can be configured to partition the one or more portions of the array of memory cells based on distance from a decoder of the apparatus and/or based on workload of the one or more portions of the array of memory cells, for example.

In one or more embodiments of the present disclosure, the controller can be configured to perform wear leveling on the array of memory cells by applying a first wear leveling scheme to a first portion of the array of memory cells and a second wear leveling scheme to a second portion of the array of memory cells. In a number of embodiments, the wear leveling scheme is based on number of cycles performed on that portion of the array of memory cells.

In one or more embodiments of the present disclosure, the controller can be configured to perform a sensing operation on the array of memory cells by applying a first set of signals to the first portion of the array of memory cells and a second set of signals to the second portion of the array of memory cells. A first signal of the first set of signals and a first signal of the second set of signals can be applied at a first time. The first signal of the first set of signals and a second signal of the first set of signal, for example, can be different.

In one or more embodiments of the present disclosure, the first state can be a set state and the second state can be a reset state. A set state can be a state corresponding to a logic state of 1 and a reset state can be a state corresponding to a logic state of 0, although embodiments are not limited to these logic state assignments. Also, in one or more embodiments, the first state can be a reset state and the second state can be a set state.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "M", "S", "T", "W", "X", "Y", "Z", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system including an apparatus in the form of a number of memory systems 104-1 ... 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 ... 104-N can include one or more memory devices, such as memory devices 110-1, ..., 110-X, 110-Y. Memory devices 110-1, ..., 110-X, 110-Y can include volatile memory and/or non-volatile memory. In a number of embodiments, memory systems 104-1, ..., 104-N can include a multi-chip device. A multi-chip device can include a number of different memory types. For example, a memory system can include a number of chips having non-volatile or volatile memory on any type of a module. In FIG. 1A, memory system 104-1 is coupled to the host 102 via channels 112-1 can include memory devices 110-1, ..., 110-X. For example, memory device 110-1 can be a non-volatile cross-point array memory device and 110-X can be a NAND flash memory device. In this example, each memory device 110-1, ..., 110-X, 110-Y includes a controller 114. Controller 114 can receive commands from host 102 and control execution of the commands on a memory device. The host 102 can send commands to the memory devices 110-1, ..., 110-X, 110-Y. For example, the host can communicate on the same channel (e.g., channel 112-1) with a non-volatile cross-point array memory device and a NAND flash memory device that are both on the same memory system.

As illustrated in FIG. 1A, a host 102 can be coupled to the memory systems 104-1 ... 104-N. In a number of embodiments, each memory system 104-1 ... 104-N can be coupled to host 102 via a channel. In FIG. 1A, memory system 104-1 is coupled to host 102 via channel 112-1 and memory system 104-N is coupled to host 102 via channel 112-M. Host 102 can be a laptop computer, personal computers, digital camera, digital recording and playback device, mobile telephone, PDA, memory card reader, interface hub, among other host systems, and can include a memory access device (e.g., a processor). One of ordinary skill in the art will appreciate that "a processor" can intend one or more processors, such as a parallel processing system, a number of coprocessors, etc.

Host 102 can send commands to the memory devices 110-1, ..., 110-X, 110-Y via channels 112-1 ... 112-M. The host 102 can communicate with the memory devices 110-1, ..., 110-X, 110-Y and/or the controller 114 on each of the memory devices 110-1, ..., 110-X, 110-Y to read, write, erase, and sense data, among other operations. A physical host interface can provide an interface for passing control, address, data, and other signals between the memory systems 104-1 ... 104-N and host 102 having compatible receptors for the physical host interface. The signals can be communicated between host 102 and memory devices 110-1, ..., 110-X, 110-Y on a number of buses, such as a data bus and/or an address bus, for example, via channels 112-1 ... 112-M.

The host 102 and/or controller 114 on a memory device can include control circuitry (e.g., hardware, firmware, and/ or software). In one or more embodiments, the host 102 and/or controller 114 can be an application specific integrated circuit (ASIC) coupled to a printed circuit board including a physical interface. Also, each memory device 110-1, ..., 110-X, 110-Y can include one or more counters 118-1, ..., 118-Z, 118-W. Each counter 118-1, ..., 118-Z, 118-W can count a number of cycles performed on a first portion of an array of memory cells and/or count a number of cycles performed on a second portion of an array of memory cells.

The memory devices 110-1, ..., 110-X, 110-Y can provide main memory for the memory system or could be used as additional memory or storage throughout the memory system. Each memory device 110-1, ..., 110-X, 110-Y can include one or more arrays of memory cells (e.g., non-volatile memory cells). The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 ... 104-N can include address circuitry to latch address signals provided over I/O connections through I/O circuitry. Address signals can be received and decoded by a row decoder and a column decoder to access the memory devices 110-1, ..., 110-X, 110-Y. It will be appreciated by those skilled in the art that the number of address input connections can depend on the density and architecture of the memory devices 110-1, ..., 110-X, 110-Y.

Figure 1B:
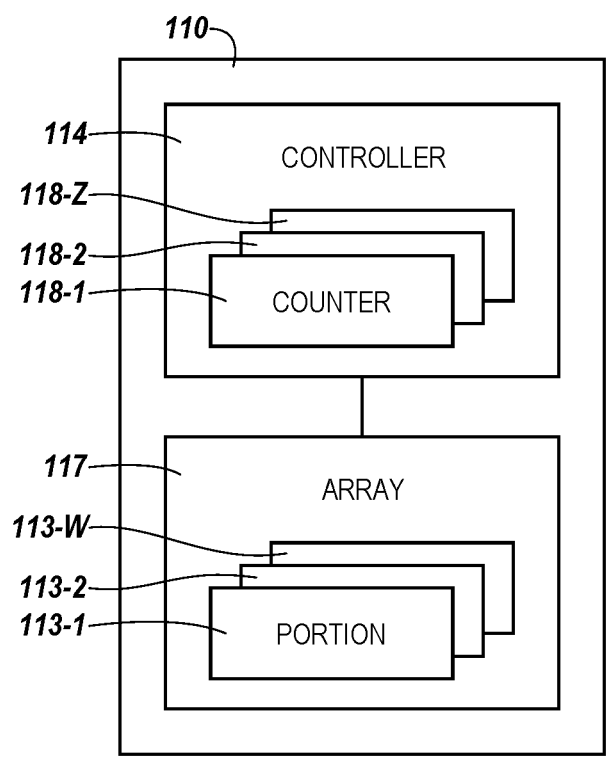
FIG. 1B is a block diagram of an apparatus in the form of a memory device in accordance with a number of embodiments of the present disclosure.

FIG. 1B is a block diagram of an apparatus in the form of a memory device in accordance with a number of embodiments of the present disclosure. In FIG. 1B, memory device 110 can include a controller 114 and an array of memory cells 117. The array of memory cells 117 can include one or more portions 113-1, ..., 113-W. For example, the one or more portions 113-1, ..., 113-W can include a first portion 113-1 and a second portion 113-2. The first portion 113-1 of the array of memory cells 117 can include user data and the second portion 113-2 of the array of memory cells 117 can include metadata, for example. In one or more embodiments, the apparatus can be used in a mobile application. The controller 114 can be configured to partition the array 117 into the first portion 113-1 and the second portion 113-2. The controller 114 can be configured to partition the one or more portions 113-1, ..., 113-W of the array 117 based on distance from a decoder of the apparatus and/or based on workload. The controller 114 can include one or more counters 118-1, ..., 118-Z. The one or more counters 118-1, ..., 118-Z can track number of cycles the one or more portions 113-1, ..., 113-W. The number of cycles performed on each portion of the one or more portions 118-1, ..., 118-Z of the array of memory cells 117 can be different because each portion of the one or more portions 118-1, ..., 118-Z of the array of memory cells 117 can be managed with a different update technique.

In one or more embodiments, the controller 114 can be configured to perform sensing operations on the array of memory cells 117. The controller 114 can apply a first signal (e.g. first signal 424 in FIG. 4) to a first portion 113-1 of the array of memory cells 117 and a second signal (e.g. second signal 426 in FIG. 4) to a second portion 113-2 of the array of memory cells 117. The first signal can be based on a number of cycles performed on the first portion 113-1 of the array of memory cells 117 and the second signal can be based on a number of cycles performed on the second portion 113-2 of the array of memory cells 117. The number of cycles performed on the first portion 113-1 of the array of memory cells 117 can be different than the number of cycles performed on the second portion 113-2 of the array of memory cells 117. For example, the number of cycles performed on the first portion 113-1 of the array of memory cells 117 can be different than the number of cycles performed on the second portion 113-2 of the array of memory cells 117 because the first portion 113-1 of the array of memory cells 117 and the second portion 113-2 of the array of memory cells 117 are managed with different update techniques. The first signal can be partially based on location of the first portion 113-1 of the array of memory cells 117 and the second signal can be partially based on location of the second portion 113-2 of the array of memory cells 117 and/or the first signal can be partially based on a distance from a decoder to the first portion 113-1 of the array of memory cells 117 and the second signal can be partially based on a distance from a decoder to the second portion 113-2 of the array of memory cells 117.

In one or more embodiments, the controller 114 can be configured to perform wear leveling on the array of memory cells 117 by applying a first wear leveling scheme to the first portion 113-1 of the array of memory cells 117 and a second wear leveling scheme to the second portion 113-2 of the array of memory cells 117. The first wear leveling scheme can be based on the number of cycles performed on the first portion 113-1 of the array of memory cells 117 and the second wear leveling scheme can be based on the number of cycles performed on the second portion 113-2 of the array of memory cells 117, for example.

Figure 2:
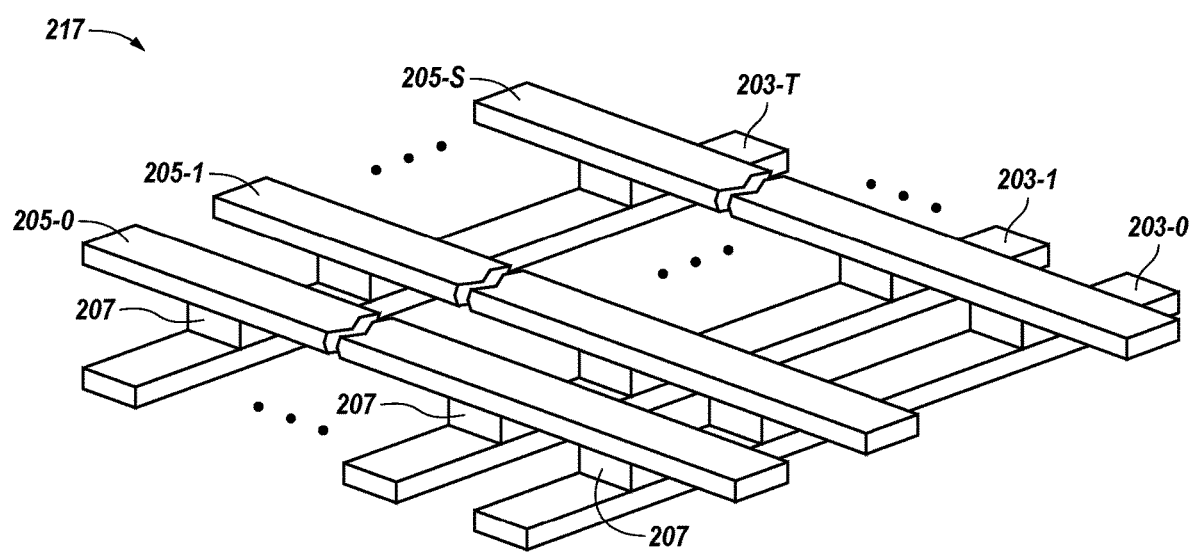
FIG. 2 is a block diagram of a portion of an array of memory cells in accordance with a number of embodiments of the present disclosure.

FIG. 2 is a block diagram of a portion of an array 217 of memory cells 207 in accordance with a number of embodiments of the present disclosure. The array 217 can be a two terminal cross-point array having memory cells 207 located at the intersections of a first plurality of conductive lines (e.g., access lines) 203-0, 203-1, . . . , 203-T, which may be referred to herein as word lines, and a second plurality of conductive lines (e.g., data/sense lines, 205-0, 205-1, . . . , 205-S) which may be referred to herein as bit lines. The designators S and T can have various values. Embodiments are not limited to a particular number of word lines and/or bit lines. As illustrated, the word lines 203-0, 203-1, . . . , 203-T are parallel to each other and are orthogonal to the bit lines 205-0, 205-1, . . . , 205-S, which are substantially parallel to each other; however, embodiments are not so limited. The conductive lines can include conductive material (e.g., a metal material). Examples of the conductive material include, but are not limited to, tungsten, copper, titanium, aluminum, and/or combinations thereof, among other conductive materials.

Each memory cell 207 may include a memory element (e.g., a resistive memory element) coupled in series with a select device (e.g., an access device) in accordance with a number of embodiments described herein. In one or more embodiments, the function of the memory element and the select device are carried out by a single material or element featuring both selecting and storage properties. The memory element and the select device are discussed further herein.

The select devices can be operated (e.g., turned on/off) to select/deselect the memory element in order to perform operations such as data programming (e.g., writing, and/or data sensing (e.g., reading operations)). The select device can be a diode, a bipolar junction transistor, a MOS transistor, and/or an Ovonic threshold switch, among other devices. In operation, appropriate voltage and/or current signals (e.g., pulses) can be applied to the bit lines and word lines in order to program data to and/or read data from the memory cells 207. The memory cells 207 can be programmed to a set state (e.g., low resistance) or a reset state (e.g., high resistance). As an example, the data stored by a memory cell 207 of array 217 can be determined by turning on a select device and sensing a current through the memory element. The current sensed on the bit line corresponding to the memory cell 207 being read corresponds to a resistance level of the memory element (e.g., a resistance level of a resistance variable material) which in turn may correspond to a particular data state (e.g., a binary value). The array 217 can have an architecture other than that illustrated in FIG. 2, as will be understood by one of ordinary skill in the art.

The array 217 can be a two dimensional array. For example, the memory cells 207 of the array 217 can be arranged between the access lines, 203-0, 203-1, . . . , 203-T and the data/sense lines, 205-0, 205-1, . . . , 205-S in a single level. The array 217 can be a three dimensional array. For example, the memory cells of the array can be arranged in multiple levels, where each of the multiple levels has memory cells organized in a cross point architecture. For three dimensional array embodiments of the present disclosure, a vertical string of memory cells can be coupled to a data line and a plurality of access lines coupled to the vertical string of memory cells, for instance.

The access lines 203-0, 203-1, . . . , 203-T and the data/sense lines 205-0, 205-1, . . . , 205-S can be coupled to decoding circuits formed in a substrate material (e.g., formed adjacent to or for example below) the array 217 and used to interpret various signals (e.g., voltages and/or currents) on the access lines and/or the data/sense lines. As an example, the decoding circuits may include row decoding circuits for decoding signals on the access lines, and column decoding circuits for decoding signals on the data/sense lines.

As used in the present disclosure, the term substrate material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS) (e.g., a CMOS front end with a metal backend) and/or other semiconductor structures and technologies. Various elements (e.g., transistors, and/or circuitry), such as decode circuitry for instance, associated with operating the array 217 can be formed in/on the substrate material such as via process steps to form regions or junctions in the base semiconductor structure or foundation.

The memory cells 207 can be formed using various processing techniques such as atomic material deposition (ALD), physical vapor deposition (PVD), chemical vapor deposition (CVD), supercritical fluid deposition (SFD), molecular beam epitaxy (MBE), patterning, etching, filling, chemical mechanical planarization (CMP), combinations thereof, and/or other suitable processes. In accordance with a number of embodiments of the present disclosure, materials may be grown in situ.

Figure 3:
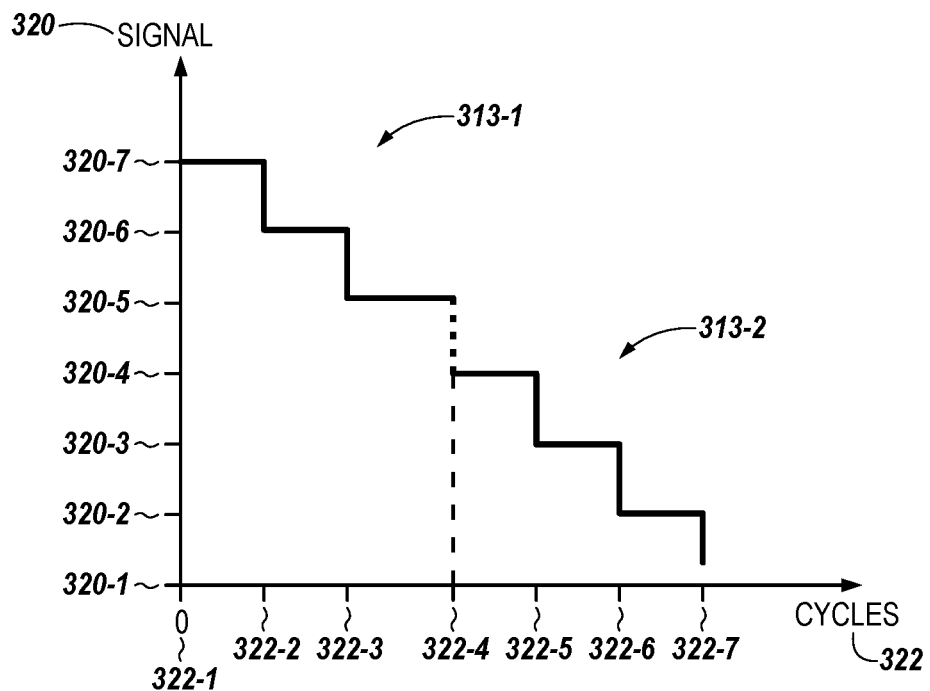
FIG. 3 illustrates a diagram associated with performing sensing operations in memory in accordance with a number of embodiments of the present disclosure.

FIG. 3 illustrates a diagram associated with performing sensing operations in memory in accordance with a number of embodiments of the present disclosure. In one or more embodiments, a controller (e.g. controller 114 in FIG. 1B) can partition an array of memory cells (e.g. array of memory cells 117 in FIG. 1B) into a first portion 313-1 and a second portion 313-2 and perform a sensing operation on the array of memory cells by applying a first set of signals 320-5, 320-6, and 320-7 to the first portion 313-1 of the array of memory cells and a second set of signals 320-2, 320-3, and 320-4 to the second portion 313-2 of the array of memory cells. A signal 320 applied to a portion of the array of memory cells can be based on a number of cycles 322 performed on that portion of the array of memory cells. The first portion 313-1 of the array of memory cells and the second portion 313-2 of the array of memory cells can be distinguished based on the type of data in the portion (e.g. user data and/or metadata), the distance the portion of the array of memory cells is from a decoder, and/or location of the portion of the array of memory cells.

In one or more embodiments of the present disclosure, a first signal 320-7 of the first set of signals 320-5, 320-6, and 320-7 and a first signal 320-4 of the second set of signals 320-2, 320-3, and 320-4 can be applied at the same time, for example, at a first time. The first signal 320-7, the second signal 320-6, and the third signal 320-5 can each be different from each other, wherein the first signal 320-7 can be applied when portion 313-1 has a cycle count between 322-1 to 322-2, the second signal 320-6 has a cycle count between 322-2 to 322-3, and the third signal 320-5 can be applied when portion 313-1 has a cycle count higher than 322-3 and/or between 322-3 to 322-4.

In one or more embodiments of the present disclosure, the first signal 320-4, the second signal 320-3, and the third signal 320-2 of the second set can each be different from each other, wherein the first signal 320-4 can be applied when portion 313-2 has a cycle count between 322-4 to 322-5, the second signal 320-3 has a cycle count of 322-5 between 322-6, and the third signal 320-2 can be applied when portion 313-2 has a cycle count higher than 322-6 and/or between 322-6 to 322-7. In one or more embodiments of the present disclosure, the cycle counts for portion 313-1 and portion 313-2 can overlap. For example, 322-4 and 322-1 can have the same initial cycle count and the signal applied based on the cycle count can step at various and/or different increments for portions 313-1 and 313-2. The cycle count and signal increments for portion 313-1 and 313-2 can vary and do not need be constant or equal.

Figure 4:
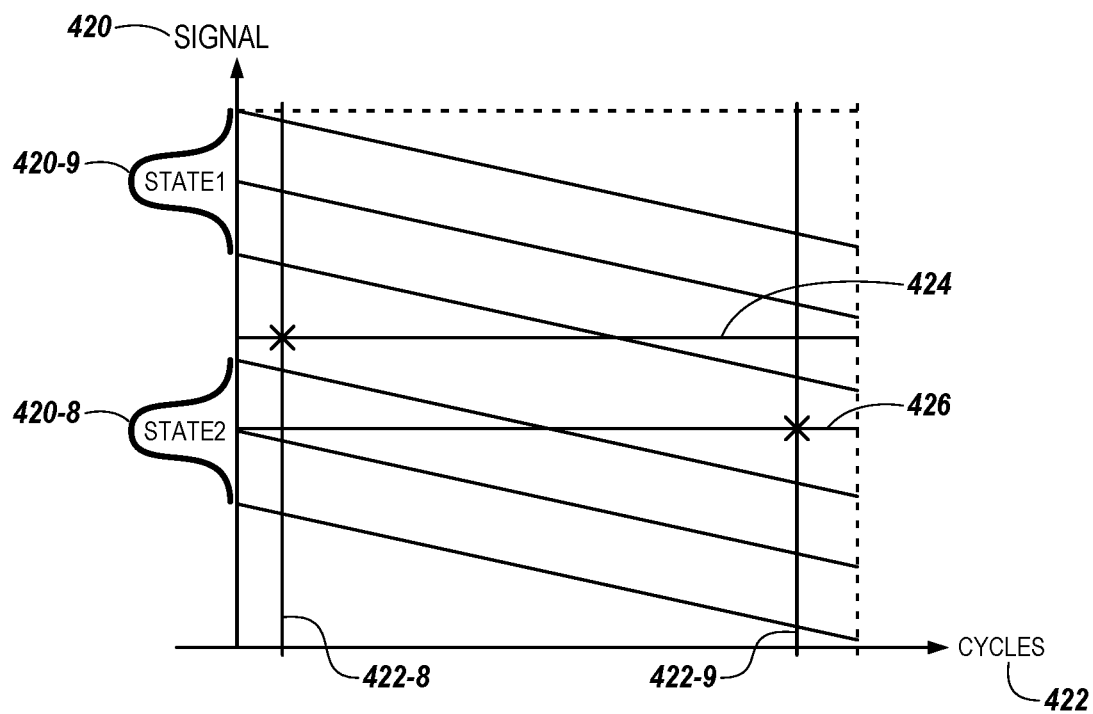
FIG. 4 illustrates a diagram associated with performing sensing operations in memory in accordance with a number of embodiments of the present disclosure.

FIG. 4 illustrates a diagram associated with performing sensing operations in memory in accordance with a number of embodiments of the present disclosure. A signal can be applied to a portion of an array of memory cells (e.g. array of memory cells 117 in FIG. 1B) to identify a threshold voltage 421 corresponding to the state of each memory cell in the portion of the array of memory cells. Memory cells at a first state, e.g. reset state, can be in a first threshold voltage range 420-9. Memory cells at a second state, e.g. set state, can be in a second threshold voltage range 420-8. The first threshold voltage range 420-9 and the second threshold voltage range 420-8 can change as the number of cycle counts of that portion of the array of memory cells increases. In other words, the signal applied can be based on the number of cycle counts of the portion of the array of memory cells. For example, a sensing operation applying a first signal 424 that is between the first threshold voltage range 420-9 and the second threshold voltage range 420-8 can be applied when cycle count is at a first number 422-8 and a sensing operation applying a second signal 426 that is between the first threshold voltage range 420-9 and the second threshold voltage range 420-8 can be applied when the cycle count is at a second number 422-9. The first signal 424 and the second signal 426 can be the same when the number of cycles performed on the first portion (e.g. first portion 313-1 in FIG. 3) of the array of memory cells is within a range of the number of cycles performed on the second portion of the array of memory cells (e.g. second portion 313-2 in FIG. 3).

In one or more embodiments of the present disclosure, a controller can be configured to partition the array of memory cells into a first portion and a second portion. The first portion of the array of memory cells can be at a first cycle count 422-8 and the second portion of the array of memory cells can be at a second cycle count 422-9. The controller can be configured to perform a sensing operation on the array of memory cells by applying a first signal 424 to the first portion of the array of memory cells and a second signal 426 to the second portion of the array of memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells; and
a controller configured to:
partition the array of memory cells based on workload into a first portion of the array of memory cells, wherein a cycle count of the first portion is monitored and the first portion is configured to store metadata, and partition the array of memory cells into a second portion of the array of memory cells, wherein a cycle count of the second portion is monitored and the second portion is configured to store user data;
perform sensing operations on the array of memory cells to identify a threshold voltage corresponding to a state of each memory cell in the array of memory cells with a first set of signals for the first portion and a second set of signals for the second portion by determining the cycle count of the first portion of the array of memory cells and applying the first set of signals to the first portion of the array of memory cells and by determining the cycle count of the second portion of the array of memory cells and applying the second set of signals to the second portion of the array of memory cells, wherein the first set of signals include magnitudes that are different than magnitudes of the second set of signals, wherein a first signal of the first set of signals is applied when the first cycle count of the first portion is within a first range, wherein a memory cell of the first portion of the array of memory cells is in a first state in response to being in a first threshold voltage range and in a second state in response to being in a second threshold voltage range, and wherein a second signal of the first set of signals is applied when the first cycle count of the first portion is within a second range, wherein the memory cell of the first portion of the array of memory cells is in the first state in response to being in a third threshold voltage range different from the first threshold voltage range and in the second state in response to being in a fourth threshold voltage range different from the second threshold voltage range, and wherein a magnitude of the first signal is greater than a magnitude of the second signal when the first range is less than the second range, and wherein a third signal of the second set of signals is applied when the cycle count of second portion is within the first range, wherein a memory cell of the second portion of the array of memory cells is in the first state in response to being in a fifth threshold voltage range and in the second state in response to being in a sixth threshold voltage range, and wherein a fourth signal of the second set of signals is applied when the cycle count of the second portion is within the second range, wherein the memory cell of the second portion of the array of memory cells is in the first state in response to being in a seventh threshold voltage range different from the fifth threshold voltage range and in the second state in response to being in an eighth threshold voltage range different from the sixth threshold voltage range, and wherein a magnitude of the third signal is greater than a magnitude of the fourth signal when the first range is less than the second range, and wherein the magnitude of the first signal, the magnitude of the second signal, the magnitude of the third signal, and the magnitude of the fourth signal are different from each other.

2. The apparatus of claim 1, wherein a signal increment between the first signal and the second signal is different from a signal increment between the third signal and the fourth signal.

3. The apparatus of claim 1, wherein the controller is configured to partition the array of memory cells at least partially based on a location of the first portion of the array of memory cells and a location of the second portion of the array of memory cells.

4. The apparatus of claim 1, wherein the controller is configured to partition the array of memory cells at least partially based on a distance from a decoder of the apparatus to the first portion of the array of memory cells and a distance from the decoder of the apparatus to the second portion of the array of memory cells.

5. The apparatus of claim 1, wherein the controller is configured to partition the array of memory cells into the first portion of the array of memory cells and the second portion of the array of memory cells at least partially based on type of data in the first portion of the array of memory cells and type of data in the second portion of the array of memory cells.

6. The apparatus of claim 1, wherein the controller is configured to perform wear leveling on the array of memory cells by applying a first wear leveling scheme to the first portion of the array of memory cells to manage the cycle count of the first portion and a second wear leveling scheme to the second portion of the array of memory cells to manage the second cycle count of the second portion.

7. The apparatus of claim 6, wherein the first wear leveling scheme is based on the cycle count of the first portion and the second wear leveling scheme is based on the cycle count of the second portion.

8. The apparatus of claim 1, wherein the array of memory cells includes a number of portions of the array of memory cells including the first portion of the array of memory cells and the second portion of the array of memory cells.

9. The apparatus of claim 1, wherein the apparatus is used in a mobile application.

10. The apparatus of claim 1, wherein the apparatus includes a first counter to track the cycle count of the first portion and a second counter to track the cycle count of the second portion.

11. The apparatus of claim 1, wherein the first portion of the array of memory cells includes user data and the second portion of the array of memory cells includes metadata.

12. An apparatus, comprising:
an array of memory cells; and
a controller configured to:
    partition the array of memory cells based on workload into a first portion and a second portion, wherein a cycle count of the first portion is monitored and a cycle count of the second portion is monitored and wherein the first portion is at a first location in the array of memory cells and the second portion is at a second location in the array of memory cells; and
    perform a sensing operation on the array of memory cells to identify a threshold voltage corresponding to a state of each memory cell in the array of memory cells by applying a first set of signals to the first portion of the array of memory cells and a second set of signals to the second portion of the array of memory cells, wherein the first set of signals include magnitudes that are different than magnitudes of the second set of signals,
    wherein a first signal of the first set of signals is applied when the cycle count of the first portion within a first range, wherein a memory cell of the first portion of the array of memory cells is in a first state in response to being in a first threshold voltage range and in a second state in response to being in a second threshold voltage range, and
    wherein a second signal of the first set of signals is applied when the cycle count of the first portion is within a second range, wherein the memory cell of the first portion of the array of memory cells is in the first state in response to being in a third threshold voltage range different from the first threshold voltage range and in the second state in response to being in a fourth threshold voltage range different from the second threshold voltage range, and wherein a magnitude of the first signal is greater than a magnitude of the second signal when the first range is less than the second range, and
    wherein a third signal of the second set of signals is applied when the cycle count of the second portion is within the first range, wherein a memory cell of the second portion of the array of memory cells is in the first state in response to being in a fifth threshold voltage range and in the second state in response to being in a sixth threshold voltage range, and wherein a fourth signal of the second set of signals is applied when the cycle count of the second portion is within the second range, wherein the memory cell of the second portion of the array of memory cells is in the first state in response to being in a seventh threshold voltage range different from the fifth threshold voltage range and in the second state in response to being in an eighth threshold voltage range different from the sixth threshold voltage range, and wherein a magnitude of the third signal is greater than a magnitude of the fourth signal when the first range is less than the second range, and wherein the magnitude of the first signal, the magnitude of the second signal, the magnitude of the third signal, and the magnitude of the fourth signal are different from each other.

13. The apparatus of claim 12, wherein the controller is configured to partition the first portion and the second portion of the array of memory cells based on distance from a decoder of the apparatus.

14. The apparatus of claim 12, wherein the controller is configured to partition the first portion and the second portion of the array of memory cells based on workload.

15. The apparatus of claim 12, wherein the first portion and the second portion of the array of memory cells are managed with a different update technique.

16. An apparatus, comprising:
an array of memory cells; and
a controller configured to:
partition the array of memory cells into a first portion and a second portion based on workload, wherein a cycle count of the first portion is monitored and a cycle count of the second portion is monitored and wherein the first portion is at a first location in the array of memory cells and the second portion is at a second location in the array of memory cells;
perform a sensing operation on the array of memory cells to identify a threshold voltage corresponding to a state of each memory cell in the array of memory cells by:
applying a first signal of a first set of signals to the first portion of the array of memory cells when the cycle count of the first portion is within a first range, wherein a memory cell of the first portion of the array of memory cells is in a first state in response to being in a first threshold voltage range and in a second state in response to being in a second threshold voltage range,
applying a second signal of the first set of signals to the first portion of the array of memory cells when the cycle count of the first portion is within a second range, wherein the memory cell of the first portion of the array of memory cells is in the first state in response to being in a third threshold voltage range different from the first threshold voltage range and in the second state in response to being in a fourth threshold voltage range different from the second threshold voltage range, and wherein a magnitude of the first signal is greater than a magnitude of the second signal when the first range is less than the second range,
applying a third signal of a second set of signals to the second portion of the array of memory cells when the cycle count of the second portion is within the first range, wherein a memory cell of the second portion of the array of memory cells is in the first state in response to being in a fifth threshold voltage range and in the second state in response to being in a sixth threshold voltage range, and applying a fourth signal of the second set of signals to the second portion of the array of memory cells when the cycle count of the second portion is within the second range, wherein the memory cell of the second portion of the array of memory cells is in the first state in response to being in a seventh threshold voltage range different from the fifth threshold voltage range and in the second state in response to being in an eighth threshold voltage range different from the sixth threshold voltage range, and wherein a magnitude of the third signal is greater than a magnitude of the fourth signal when the first range is less than the second range, and wherein the magnitude of the first signal, the magnitude of the second signal, the magnitude of the third signal, and the magnitude of the fourth signal are different from each other; and perform wear leveling on the array of memory cells by applying a first wear leveling scheme to the first portion of the array of memory cells to manage the first cycle count of the first portion and a second wear leveling scheme to the second portion of the array of memory cells to manage the second cycle count of the second portion.

17. The apparatus of claim 16, wherein the first signal of the first set of signals and the third signal of the second set of signals are applied at a first time.

18. The apparatus of claim 16, wherein the cycle count of the first portion is tracked by a first counter and the cycle count of the second portion is tracked by a second counter.

19. A method, comprising:
performing sensing operations on an array of memory cells to identify a threshold voltage corresponding to a state of each memory cell in the array of memory cells by applying a first set of signals to a first portion of the array of memory cells and a second set of signals to a second portion of the array of memory cells, wherein the first portion and second portion of the array are partitioned based on workload, wherein a cycle count of the first portion and a cycle count of the second portion are monitored, wherein the first set of signals includes magnitudes that are different than magnitudes of the second set of signals, and wherein the first portion is at a first location in the array of memory cells and the second portion is at a second location in the array of memory cells,
wherein a first signal of the first set of signals is applied when the cycle count of the first portion is within a first range, wherein a memory cell of the first portion of the array of memory cells is in a first state in response to being in a first threshold voltage range and in a second state in response to being in a second threshold voltage range, and
wherein a second signal of the first set of signals is applied when the cycle count of the first portion is within a second range, wherein the memory cell of the first portion of the array of memory cells is in the first state in response to being in a third threshold voltage range different from the first threshold voltage range and in the second state in response to being in a fourth threshold voltage range different from the second threshold voltage range, and wherein a magnitude of the first signal is greater than a magnitude of the second signal when the first range is less than the second range, and wherein a third signal of the second set of signals is applied when the cycle count of the second portion is within the first range, wherein a memory cell of the second portion of the array of memory cells is in the first state in response to being in a fifth threshold voltage range and in the second state in response to being in a sixth threshold voltage range, and wherein a fourth signal of the second set of signals is applied when the cycle count of the second portion is within the second range, wherein the memory cell of the second portion of the array of memory cells is in the first state in response to being in a seventh threshold voltage range different from the fifth threshold voltage range and in the second state in response to being in an eighth threshold voltage range different from the sixth threshold voltage range, and wherein a magnitude of the third signal is greater than a magnitude of the fourth signal when the first range is less than the second range, and wherein the magnitude of the first signal, the magnitude of the second signal, the magnitude of the third signal, and the magnitude of the fourth signal are different from each other.

20. The method of claim 19, wherein a range increment between the first range and the second range is different from a range increment between the second range and the third range.

21. The method of claim 19, wherein the first portion of the array of memory cells and the second portion of the array of memory cells are managed with different update techniques.

22. The method of claim 19, further comprising partitioning the array of memory cells into the first portion of the array of memory cells and the second portion of the array of memory cells.

23. The method of claim 19, further comprising performing wear leveling on the array of memory cells.

24. The method of claim 23, further comprising performing wear leveling on the array of memory cells by applying a first wear leveling scheme to the first portion of the array of memory cells to manage the cycle count of the first portion and a second wear leveling scheme to the second portion of the array of memory cells to manage the cycle count of the second portion.

25. The method of claim 24, wherein the first wear leveling scheme is based on the cycle count of the first portion and the second wear leveling scheme is based on the cycle count of the second portion.

26. A method, comprising:
partitioning an array of memory cells based on workload into a first portion of the array of memory cells and a second portion of the array of memory cells, wherein the first portion is at a first location in the array of memory cells and the second portion is at a second location in the array of memory cells;
monitoring a cycle count of the first portion and a cycle count of the second portion; and
performing sensing operations on the array of memory cells to identify a threshold voltage corresponding to a state of each memory cell in the array of memory cells by:
applying a first signal of a first set of signals to the first portion of the array of memory cells when the cycle count of the first portion is within a first range, wherein a memory cell of the first portion of the array of memory cells is in a first state in response to being in a first threshold voltage range and in a second state in response to being in a second threshold voltage range, wherein the first set of signals include magnitudes that are different than magnitudes of the second set of signals,
applying a second signal of the first set of signals to the first portion of the array of memory cells when the cycle count of the first portion is within a second range, wherein the memory cell of the first portion of the array of memory cells is in the first state in response to being in a third threshold voltage range different from the first threshold voltage range and in the second state in response to being in a fourth threshold voltage range different from the second threshold voltage range, and wherein a magnitude of the first signal is greater than a magnitude of the second signal when the first range is less than the second range, and
applying a third signal of a second set of signals to the second portion of the array of memory cells when the cycle count of the second portion is within the first range, wherein a memory cell of the second portion of the array of memory cells is in the first state in response to being in a fifth threshold voltage range and in the second state in response to being in a sixth threshold voltage range, and
applying a fourth signal of the second set of signals to the second portion of the array of memory cells when the cycle count of the second portion is within the second range, wherein the memory cell of the second portion of the array of memory cells is in the first state in response to being in a seventh threshold voltage range different from the fifth threshold voltage range and in the second state in response to being in an eighth threshold voltage range different from the sixth threshold voltage range, and wherein a magnitude of the third signal is greater than a magnitude of the fourth signal when the first range is less than the second range, and wherein the magnitude of the first signal, the magnitude of the second signal, the magnitude of the third signal, and the magnitude of the fourth signal are different from each other; and
performing wear leveling on the array of memory cells by applying a first wear leveling scheme to the first portion of the array of memory cells to manage the first cycle count and a second wear leveling scheme to the second portion of the array of memory cells to manage the second cycle count.

27. The method of claim 26, wherein the first wear leveling scheme is based on the cycle count of the first portion and the second wear leveling scheme is based on the cycle count of the second portion.

* * * * *